(12) United States Patent
Best et al.

(10) Patent No.: US 7,501,215 B2
(45) Date of Patent: Mar. 10, 2009

(54) DEVICE MANUFACTURING METHOD AND A CALIBRATION SUBSTRATE

(75) Inventors: Keith Frank Best, Best (NL); Joseph J. Consolini, Costa Mesa, CA (US); Alexander Friz, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 709 days.

(21) Appl. No.: 11/167,578

(22) Filed: Jun. 28, 2005

(65) Prior Publication Data

US 2006/0292463 A1    Dec. 28, 2006

(51) Int. Cl.
*G03F 9/00* (2006.01)
*G03C 5/00* (2006.01)

(52) U.S. Cl. .......................... 430/22; 430/30; 430/311; 430/312; 430/313; 430/315

(58) Field of Classification Search .................. 430/22, 430/30, 311, 312, 313, 315
See application file for complete search history.

(56) References Cited

U.S. PATENT DOCUMENTS

2002/0109825 A1    8/2002    Gui et al.

2006/0023214 A1 *  2/2006    Lof et al. ................... 356/401

FOREIGN PATENT DOCUMENTS

| EP | 1 223 469 A1 | 7/2002 |
| EP | 1 400 854 A2 | 3/2004 |

* cited by examiner

*Primary Examiner*—Christopher G Young
(74) *Attorney, Agent, or Firm*—Pillsbury Winthrop Shaw Pittman LLP

(57) ABSTRACT

The present invention relates to a device manufacturing method wherein a plurality of front side marks are manufactured on the front side of the substrate. These marks are used to locally align the substrate when exposing. After certain processing steps, the positions of the front side marks are measured and compared with respect to their original positions. The measured position changes of the front side marks, i.e. their behaviour, can then be analyzed. The original positions and actual positions are defined with respect to a nominal grid which is defined using global alignment marks which are positioned at the back side of the substrate. Because the global alignment marks are positioned at the back side, they are not affected by any processing step.

9 Claims, 7 Drawing Sheets

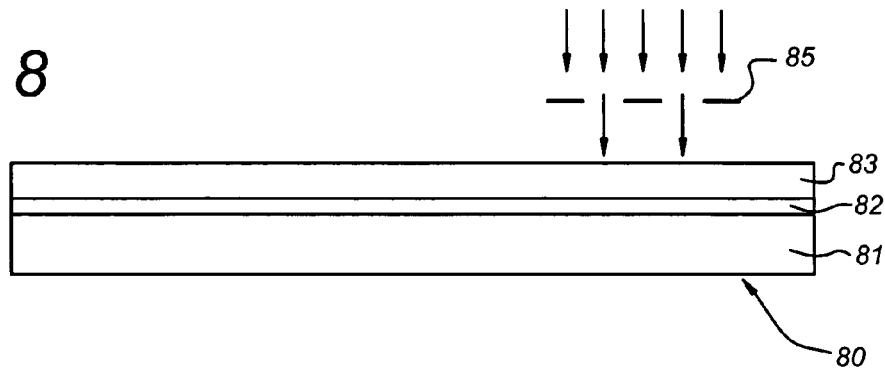
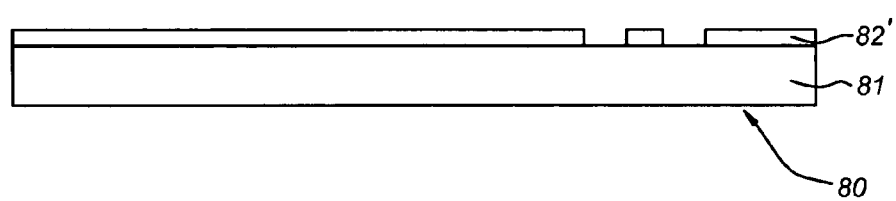
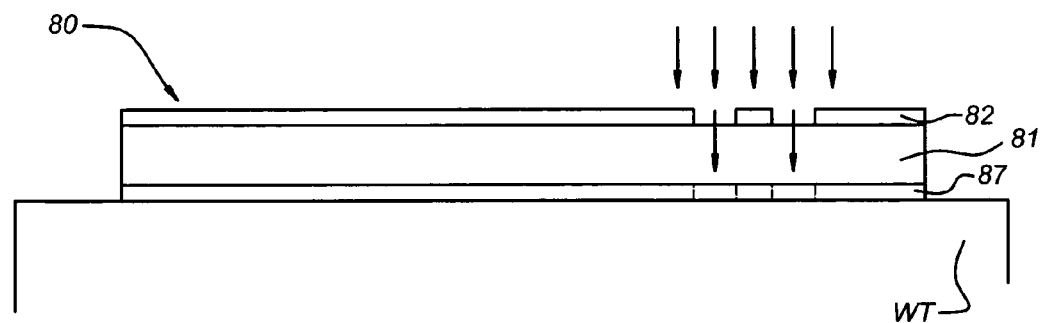
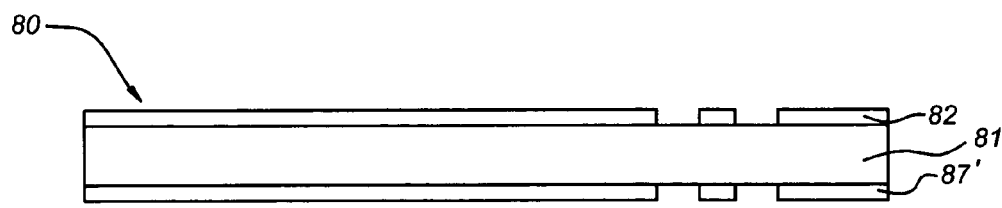

DEVICE MANUFACTURING METHOD AND A CALIBRATION SUBSTRATE

FIELD

The present invention relates to a method for manufacturing a device, more particularly for manufacturing integrated circuits.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Before exposing the substrate, it must be correctly aligned to ensure accurate projection of the functional features. Alignment marks are provided on the substrate and detected with an alignment system. Examples of alignment systems are a conventional through the lens alignment system and also the alignment methods and apparatus described in co-pending applications EP02251440 and EP02250235. The alignment marks are commonly on the front side of the substrate, but can also be on the back side of the substrate. Marks on the back side of the substrate are used particularly in the manufacture of Micro Electro Mechanical Systems (MEMS) or Micro Opto-Electro Mechanical Systems (MOEMS). If marks on the back side of a substrate are used, front-to-backside alignment (FTBA) optics project the mark on the back side of the substrate to the front side. Alternatively, if the marks on the front side of the substrate are no longer usable due to, for example, chemical mechanical polishing (CMP), epitaxial layer deposition or thick grainy metal layer deposition, back-to-backside alignment (BTBA) optics can be used. However, for true analysis of front side mark vector behaviour it is required that a set of front side global alignment marks are etched back to remove the process films covering them, in order for all other marks to be measured against the location of these front side global alignment marks. This process is typically used to evaluate CMP processes, and the resilience/accuracy delivered by segmented CMP marks. The problem with this art is that it is a slow and costly process that cannot be conducted in real time as a quality control gate. It requires short loop experiments to be run rather than using production substrates. Moreover, the polishing process for CMP is very complex and changes from substrate to substrate, so it is virtually impossible to accurately measure, and adjust for, every substrate's asymmetric/non-linear behaviour.

SUMMARY

It is desirable to provide a method of analyzing front side mark behaviour on a substrate during a device manufacturing process, without the need of etching global alignment marks.

According to an aspect of the invention, there is provided a device manufacturing method comprising:

measuring positions of global alignment marks present on a substrate having a front and a back side, using an alignment system;

defining a nominal grid on the front side of the substrate using the measured positions of the global alignment marks;

manufacturing a plurality of front side marks on the front side of the substrate;

measuring first positions of the respective front side marks with respect to the nominal grid, resulting in original positions of the respective front side marks;

executing at least one manufacturing step using the front side marks for alignment;

measuring second positions of the respective front side marks with respect to the nominal grid, resulting in actual positions of the respective front side marks;

calculating measured position changes of the front side marks using the original positions and the actual positions, characterized in that the global alignment marks are positioned at the back side of the substrate.

According to another aspect, there is provided a method of manufacturing a calibration substrate, comprising:

providing a transparent substrate;

providing a mask layer on a front side;

patterning the mask layer to render a patterned mask layer on the front side;

providing a resist layer on a back side;

exposing the resist layer on the back side with light falling on the front side and transmitted by the transparent substrate to render an exposed resist layer;

developing the exposed resist layer to render a patterned resist layer on the back side.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 shows a cross section of a substrate having a layer of chrome;

FIG. 9 shows the new surface of the substrate of FIG. 8 providing a mask of its own after the chrome layer has been partly etched;

FIG. 10 shows the substrate of FIG. 9 that is coated at the back side with a second layer of photo resist;

FIG. 11 shows a calibration substrate resulting from a method according to the invention and used to calculate an alignment beam angle;

In the Figures, corresponding reference symbols indicate corresponding parts.

DETAILED DESCRIPTION

Figure 1:
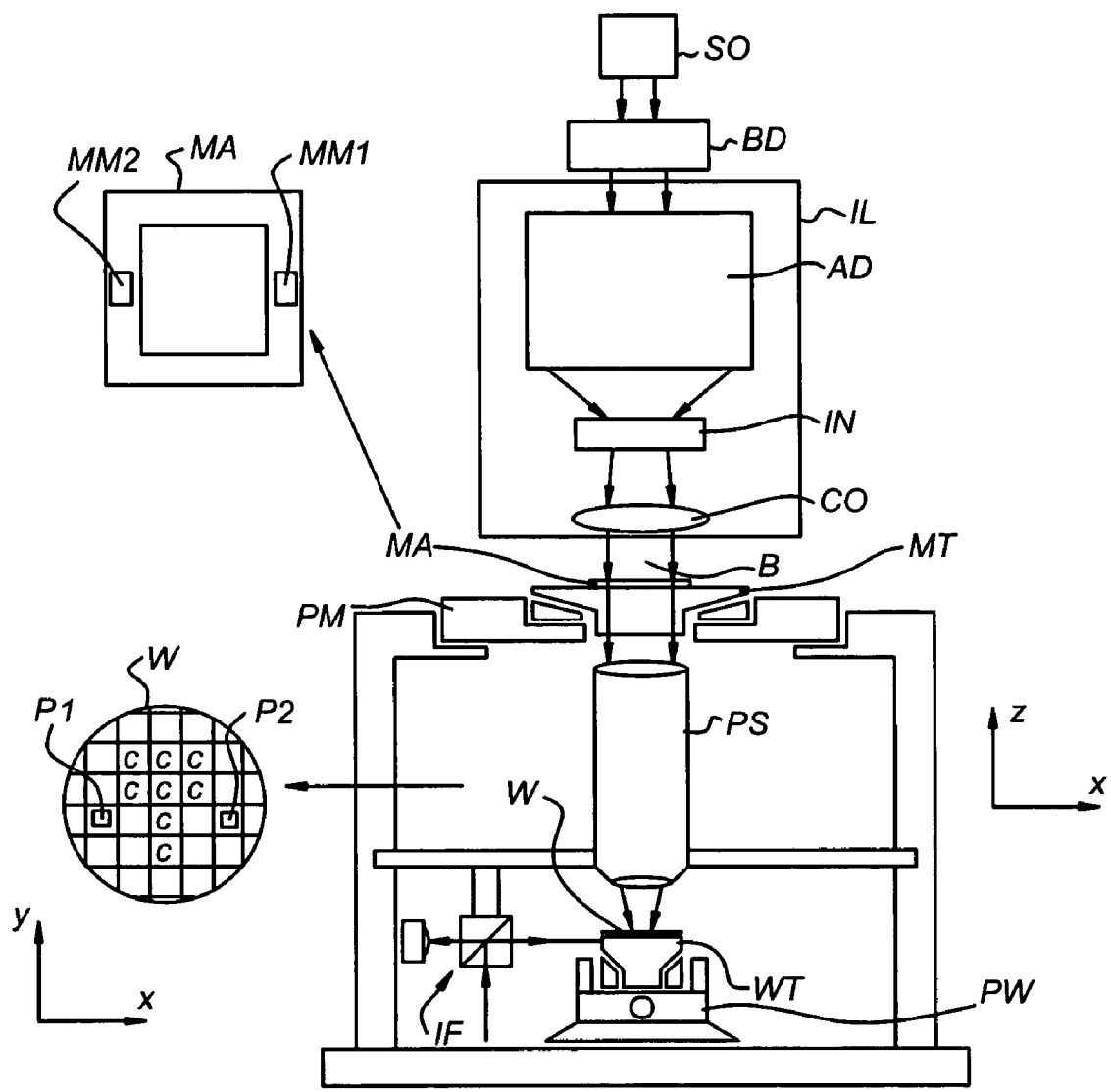
FIG. 1 depicts a lithographic apparatus as used in an embodiment of the invention.

FIG. 1 schematically depicts a lithographic apparatus as used in an embodiment of the invention. The apparatus comprises:
- an illumination system (illuminator) IL configured to condition a radiation beam B (e.g. UV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
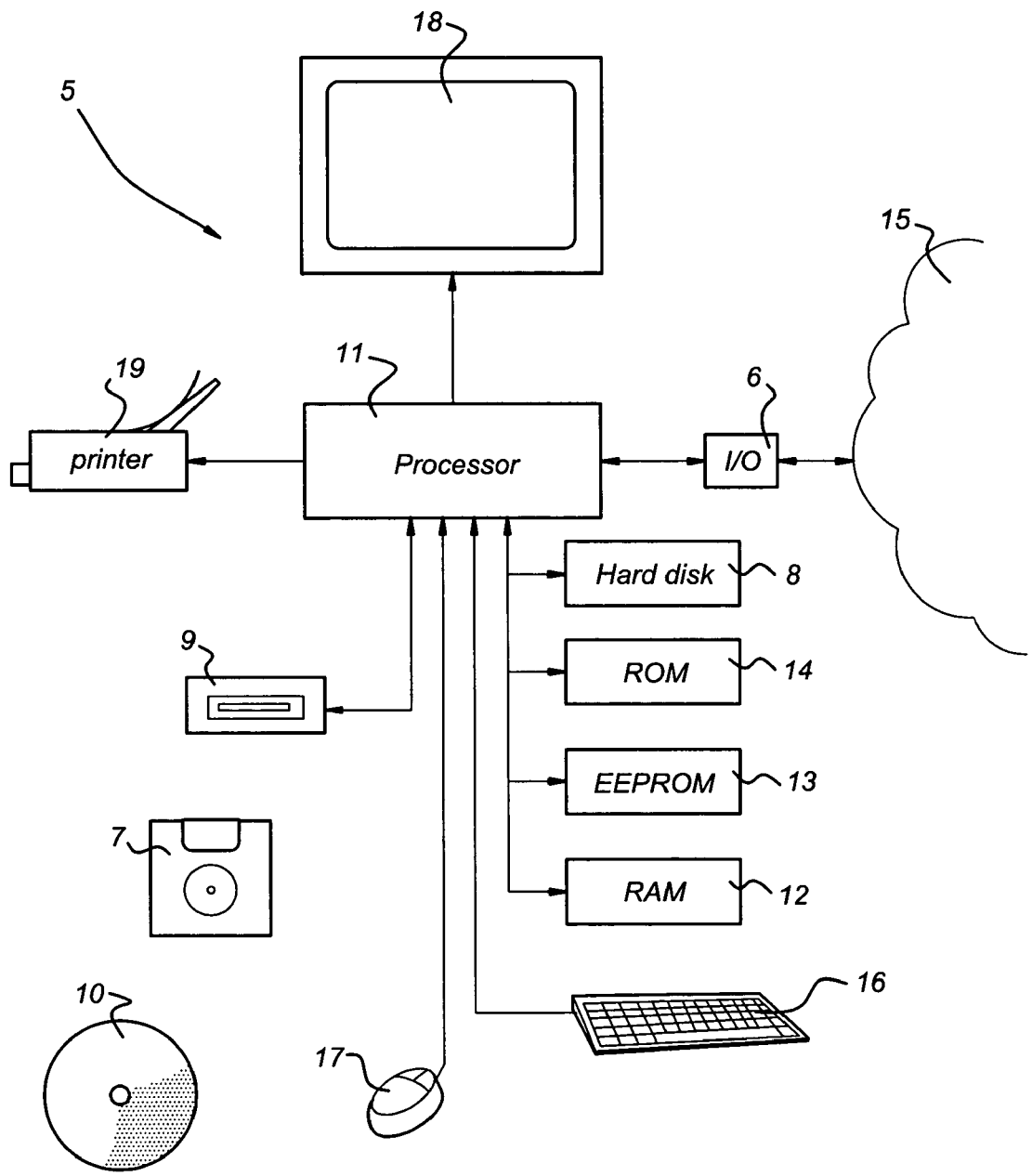
FIG. 2 shows an example of a computer arrangement used for executing methods according to the invention.

FIG. 2 shows schematically a computer arrangement as used for executing the method according to the present invention. Computer system 5 comprises host processor 11 with peripherals. The host processor 11 is connected to memory units 8, 9, 12, 13, 14 which store instructions and data, one or more reading units 30 (to read, e.g., floppy disks 7, CD ROM's 10, and/or DVD's), a keyboard 16 and a mouse 17 as input devices, and as output devices, a monitor 18 and a printer 19. Other input devices, like a trackball, a touch screen or a scanner, as well as other output devices may be provided.

Further, a network I/O device 6 is provided for a connection to a network 15.

The memory units shown comprise RAM 12, (E)EPROM 13, ROM 14, tape unit 9, and hard disk 8. However, it should be understood that there may be provided more and/or other memory units known to persons skilled in the art. Moreover, one or more of them may be physically located remote from the processor 11, if required. The processor 11 is shown as one box, however, it may comprise several processing units functioning in parallel or controlled by one main processor, that may be located remotely from one another, as is known to persons skilled in the art. The computer system 5 shown in FIG. 1 is arranged for performing computations in accordance with the method in accordance with the present invention.

Figure 3:
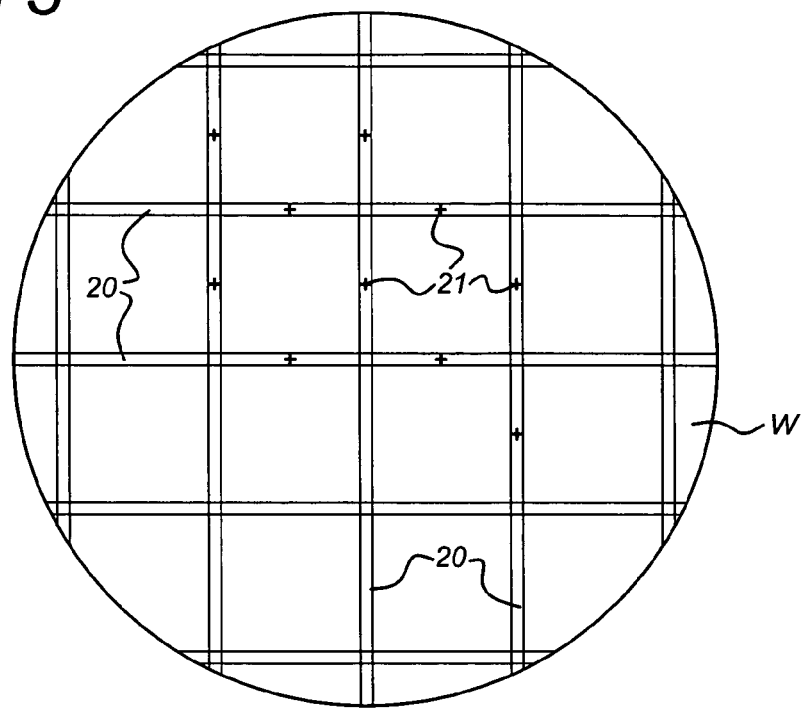
FIG. 3 shows a typical array of alignment markers on the front side of a substrate that are located in the scribe-lane areas of the substrate.

FIG. 3 shows a front side of the substrate W comprising a plurality of front side marks 21. In this example, the front side marks 21 are positioned in scribe-lanes 20. Due to chemical mechanical polishing (CMP), epitaxial layer deposition or thick grainy metal layer deposition or other processing steps, the detected position of the front side marks 21 may shift. This means that after several of such processing steps, the detected position of a front side mark 21 will deviate from the original position (i.e. the position of front side mark 21 in layer zero).

Until now, for true analysis of front side mark vector behaviour, it was required that a set of front side global alignment marks were etched back to remove the process films covering them, in order for all other marks to be measured against the location of these front side global alignment marks. The problem with this process is that it is slow and costly and that it cannot be conducted in real time as a quality control gate. It requires short loop experiments to be run rather than using production substrates.

Figure 4:
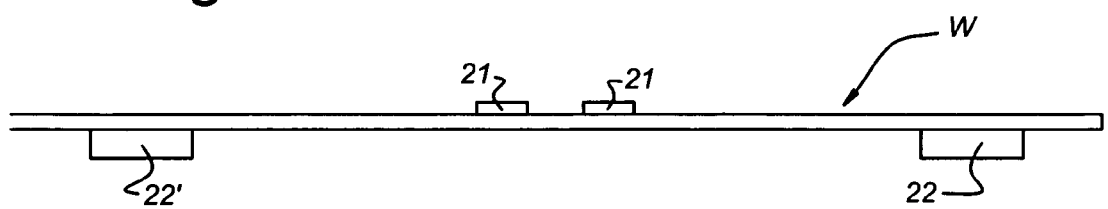
FIG. 4 shows an enlarged side view of a substrate with two front side marks and two global alignment marks at the back side.

Therefore according to the invention, the global alignment marks are positioned at the back side of the substrate W. FIG. 4 shows an enlarged side view of the substrate W. At the back side of the substrate W two global alignment marks 22, 22' are manufactured. These marks 22, 22' can be manufactured at a manufacturers site or can be prebuilt into the substrate W by a substrate supplier.

Figure 5:
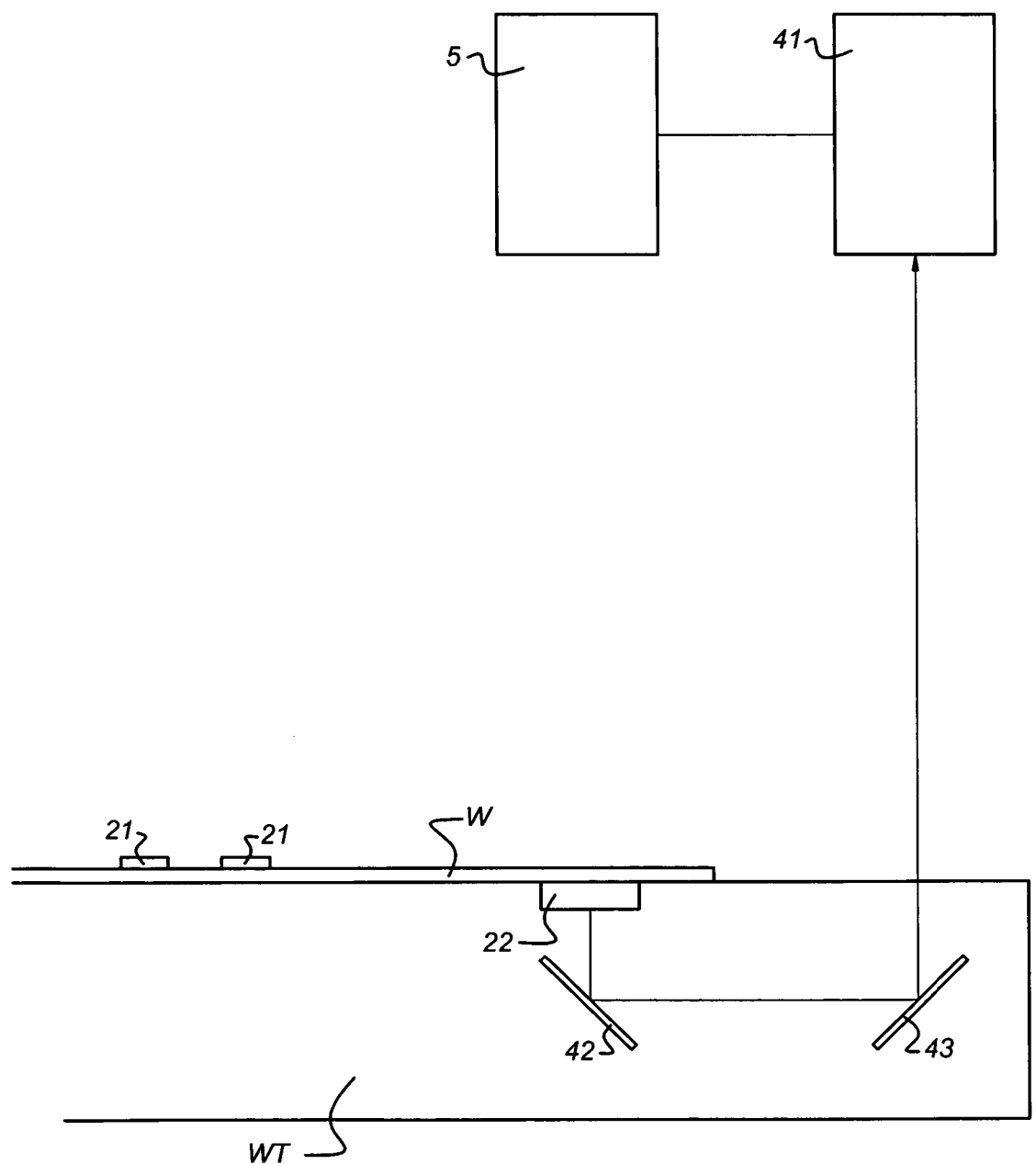
FIG. 5 shows a side view of the substrate W placed on the substrate table WT.

FIG. 5 shows a side view of the substrate W placed on the substrate table WT. The substrate table WT comprises front-to-back-side optics 42, 43 which are arranged to project an alignment beam coming from an alignment system 41 at the back-side of the substrate W. The alignment system 41 may for example be the system described in US 2002/0109825 A1 and is connected to the computer arrangement 5 of FIG. 2. The substrate W is placed on the substrate table WT, and positioned on the substrate table WT using a wafer loading mechanism. Next, the substrate table WT is moved so that the alignment system 41 detects one of the global alignment marks 22 at the back side of the substrate W. Next, the substrate table WT is moved so that a second global alignment mark 22' is detected. After detection of two global alignment marks 22, 22' a nominal grid is defined. The nominal grid is a co-ordinate system which is used to define X,Y-positions of structures at the front side of the substrate W.

Figure 6:
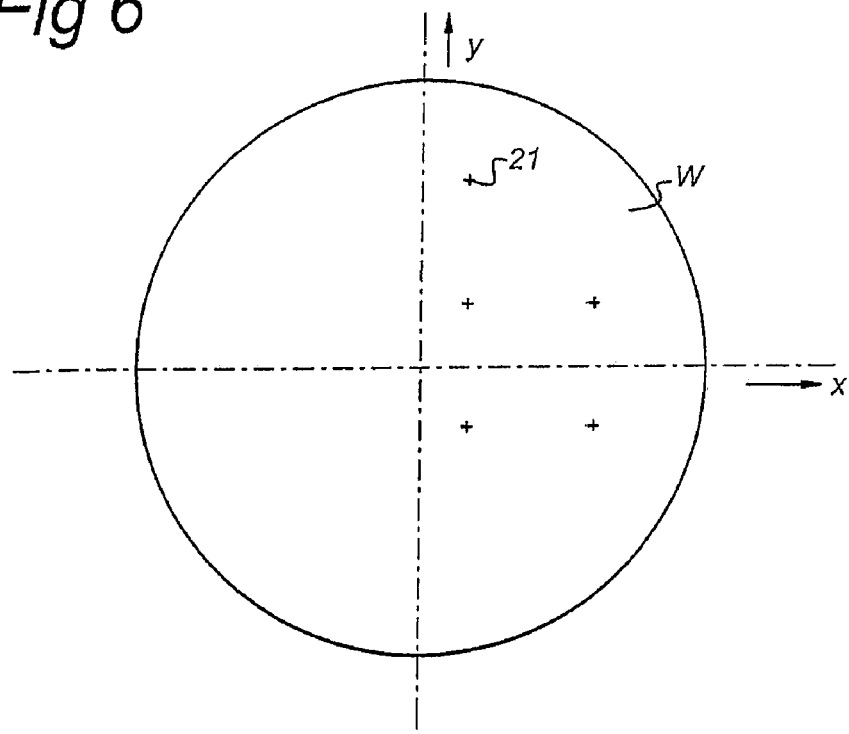
FIG. 6 shows a nominal grid defined at the front side of the substrate W.

FIG. 6 shows a nominal grid defined at the front side of the substrate W. According to the invention, the nominal grid is used to determine the positions of the front side marks 21 on the front side of the substrate W. After each processing step that requires being interrogated, e.g. epitaxial layer deposition or metal deposition or CMP, the substrate table WT is moved so as to detect the front side marks 21 by means of the alignment system 41. The exact positions of the front side marks 21 are stored in any of the memory units 8, 9, 12, 13, 14.

The invention may employ 3D alignment hardware such as that described in 2002/0109825 A1 to enable a comparison of backside marks (which are not subject to the front side process induced X,Y translation) to the front side marks, wherein X,Y displacement is caused by non-linear and asymmetric processing. Advantages of this invention include that the global alignment marks 22 on the backside allow an accurate, absolute grid to be defined, that is capable of accurately measuring all front side marks. Once the nominal grid has been defined, the front side marks 21 can be measured. The X,Y displacement of the front side marks 21 from the nominal grid location allow a software algorithm to establish each mark's deviation from where it should be.

Figure 7:
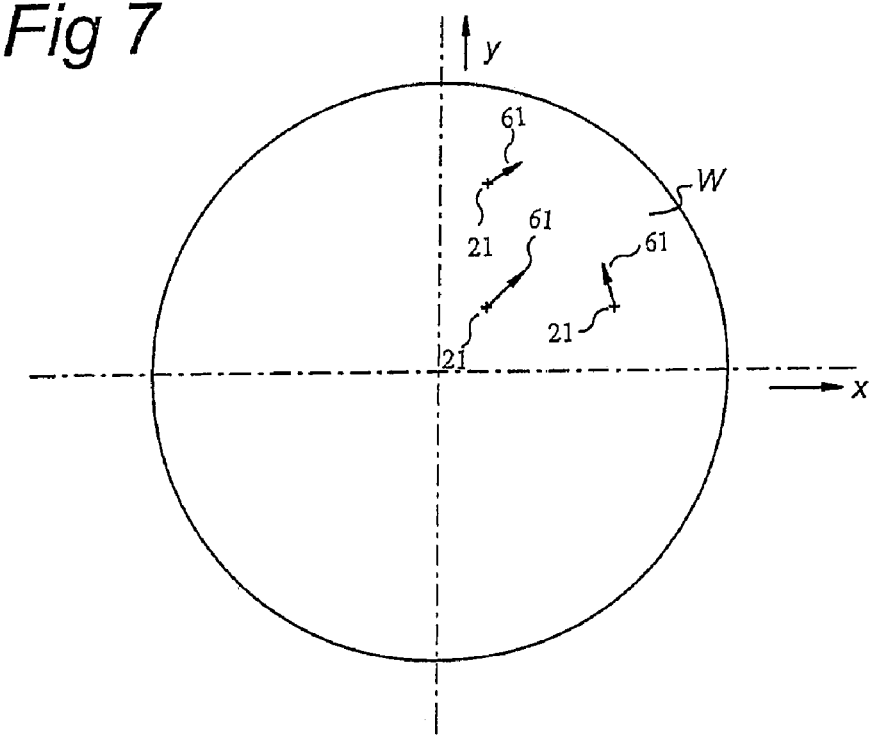
FIG. 7 is an example of a vector plot.

According to an embodiment, the deviations of the positions of the front side marks 21 from their original positions (i.e. the positions of the front side marks 21 in the zero layer) are calculated and compared to a threshold value. By using a simple model, each mark's performance is interrogated against a user defined goodness of fit criteria. Those front side marks 21 that perform bad, i.e. where the corresponding deviation is larger than the user defined goodness of fit criterion, are referred to as "bad" marks. The "bad" marks can be removed from the overlay alignment calculations In an aspect of the invention, the method of measuring the positions of the front side marks 21 is used in order to generate wafer vector plots from all front side marks 21. The front side marks 21 are measured and their X,Y co-ordinates are referenced against the co-ordinate of the global alignment marks 22, 22' at the backside which, having not been affected by the processing, serve as a reference to the nominal grid that was defined on the front side of the substrate prior to any processing. The resulting variance in X,Y position (modeled and displayed as a wafer vector plot) serves as an important metrology quality control gate to predict process out of control situations and provides a tool to identify important changes in processes used in the manufacturing of devices. FIG. 7 shows an example of a vector plot. Vectors 61 represent the deviation of the positions of the front side marks 21 from the original positions of the front side marks 21.

The method of measuring the positions of the front side marks may be used in order to improve a CMP process. Position data of the front side alignment marks 21 could be collected and saved in a database. This data can be used to analyze the substrate to substrate variation and lot to lot variation improving CMP. By continuously analyzing the modeled data it will become clear when systematic errors are increasing and out of control situations are developing (Statistical Process Control), e.g. increasing scaling errors or rotational components, as will be clear to the skilled person.

In another aspect of the invention there is provided a method of manufacturing a calibration substrate. The calibration substrate can be used to calibrate a Front To Back Alignment (FTBA) alignment beam of a lithographic apparatus.

The problem with known alignment beam calibration methods is that the calibration can only be accurate if the position of an alignment mark is known on both the front and backside of the substrate. Having a single mark does not decouple the thickness of the substrate from an error budget and hence assumptions are made adding errors.

According to this aspect, a substrate 80 having a transparent layer 81 made of for example quartz, is provided with a mask layer 82 on a front side. This mask layer 82 may be a chrome layer 82 or other 'suitable' masking material, such as Aluminum. FIG. 8 shows a cross section of the substrate 80 having the layer of chrome 82. Next, the mask layer 82 is patterned. For example, a layer of photo resist 83 can be spun on the chrome layer 82 and the substrate 80 can be exposed using a patterning structure 85. Arrows in FIG. 8 depict radiation coming from a radiation source (not shown). In an embodiment, the patterning structure 85 comprises a two dimensional grating described in patent publication EP 1400854, onto the substrate 80. The resist layer 83 is developed leaving a particular pattern in the resist layer 83, not shown. The chrome layer 82 is then etched and the new surface of the substrate provides a mask of its own, see the patterned mask layer 82' in FIG. 9.

Next, the substrate 80 is coated at a back side with a second layer of photo resist. The result is shown in FIG. 10. The substrate 80 is then placed on a substrate table WT of a lithographic apparatus with the back side facing the substrate table WT. The front side of the substrate 80 is then completely exposed to render an exposed resist layer 87. This complete exposure is known as 'flood exposure'. The exposed layer of photo resist 87 is then developed to render a patterned resist layer 87'. This method results in substrate 80 comprising two identical patterns at both sides of the substrate 80. Furthermore, the patterns on both sides are perfectly aligned, as shown in FIG. 11.

Figure 12:
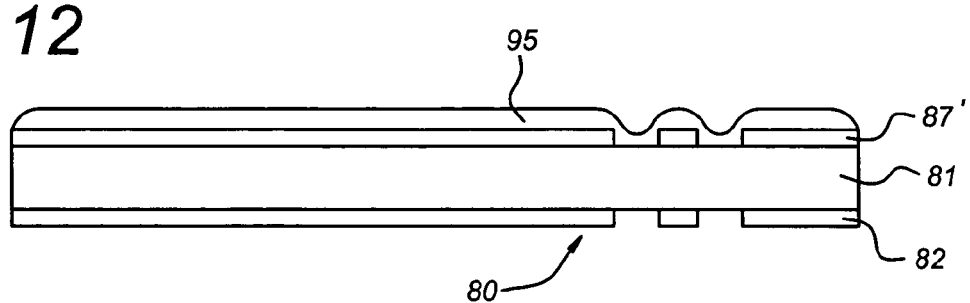
FIG. 12 illustrates an exemplary embodiment of the substrate having a material deposited on the patterned photo resist layer.
Figure 13:
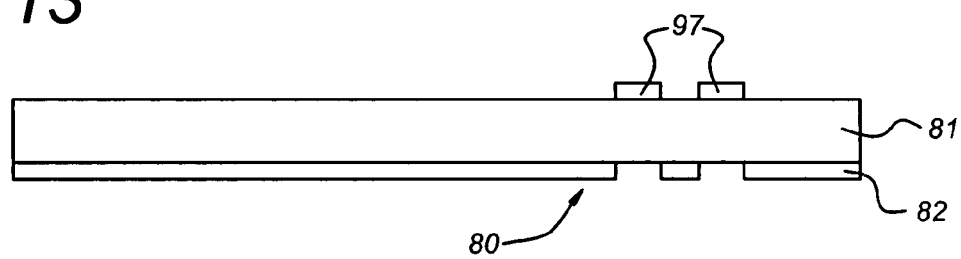
FIG. 13 illustrates an exemplary embodiment wherein portions of the material deposited on the patterned photo resist layer and the patterned photo resist layer are removed to reveal a pattern.

In an embodiment, the patterned resist layer 87' has holes. These holes are filled with a predetermined material. To achieve this, the substrate 80 is turned over and a layer of the predetermined material 95, for example chrome, is provided onto the patterned resist layer 87', using for example, sputter techniques. The result is shown in FIG. 12. Next, a part of the layer of chrome 95 is lifted off by solving part of the chrome layer 95 into a solvent so as to convert a pattern in the patterned resist layer 87' into a pattern 97 made of chrome. Finally, the patterned resist layer 87' is removed by using for example a solvent. The remaining chrome pattern is shown in FIG. 13.

Figure 14:
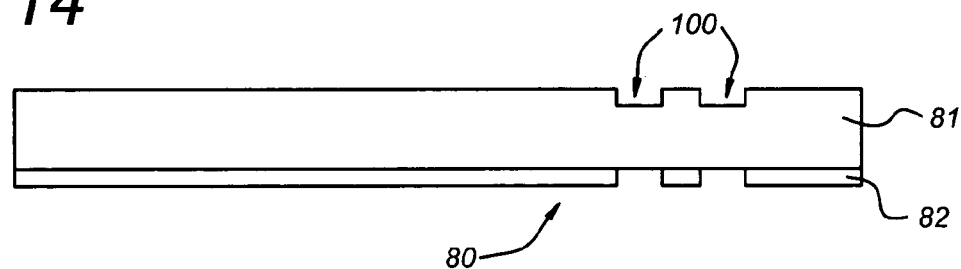
FIG. 14 illustrates an alternative embodiment of the invention wherein portions of the substrate that are not covered by the patterned photo resist layer are etched.
Figure 15:
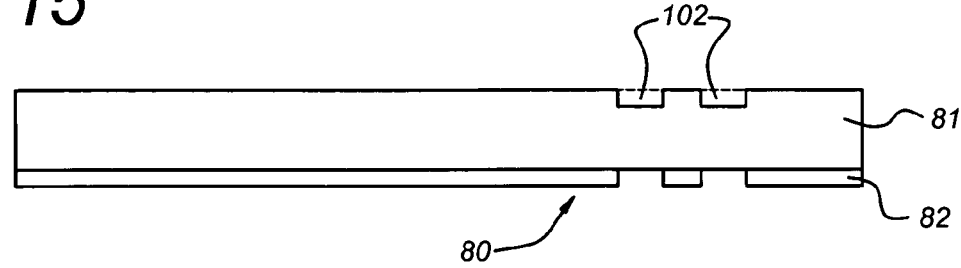
FIG. 15 illustrates an embodiment of the invention wherein the etched portion of FIG. 14 is filled with a material.

In an alternative embodiment, after developing the second layer of photo resist 87, the substrate 80 shown in FIG. 11, is turned over and holes 100 are provided on the back side of the substrate using the patterned resist layer 87' as a mask. The holes 100 may be provided using for example etching techniques. After removing the patterned resist layer 87', the substrate 80 looks as shown in FIG. 14. Next, the holes are filled with a predetermined material. This may be done by first covering the substrate 80 with for example chrome, and using a polishing technique to remove part of the chrome, resulting in a chrome pattern 102 shown in FIG. 15.

Preferably, the patterned beam used to manufacture the calibration substrate, comprises UV radiation. UV radiation can pass through quartz, which enables the manufacturing method described above. UV light will pass through the transparent layer 81 conveying the pattern from one side of the substrate 80 to the reverse side.

The calibration substrate 80 made as described above, may be used to calibrate a Front To Back alignment system. Using calibration substrates of different thicknesses allows a skilled person to determine the relationship between the calibration of the substrate table position for front and backside marks as a function of substrate thickness, and hence beam angle.

This calibration process is possible by using an orientation independent marker, such as the pattern described in EP 1 400 854. That pattern can be viewed from both sides with the same aligned position, and thus is preferred at the method according to the invention.

This new development allows for the substrate thickness to be directly accommodated during the calibration process. Furthermore, users can regularly check the calibration using calibration substrates that have the same thickness as their production substrates. Using an orientation independent mark allows this to happen since it can be viewed from both sides with the same aligned position.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A device manufacturing method comprising:
   measuring positions of global alignment marks present on a substrate having a front side and a back side, wherein said global alignment marks are positioned at the back side of said substrate;
   defining a nominal grid on the front side of said substrate using said measured positions of said global alignment marks;
   manufacturing a plurality of front side marks on the front side of the substrate;
   measuring first positions of said respective front side marks with respect to said nominal grid, resulting in original positions of the respective front side marks;
   executing at least one manufacturing step using original positions of the respective front side marks for alignment;
   after executing the at least one manufacturing step, measuring second positions of said respective front side marks with respect to said nominal grid, resulting in actual positions of the respective front side marks;
   calculating measured position changes of said front side marks due to the at least one manufacturing step using said original positions and said actual positions; and
   storing the measured position changes in a memory and making them available for further use.

2. A device manufacturing method according to claim 1, further comprising:
   making substrate vectors plots by translating each of said measured position changes into a vector.

3. A device manufacturing method according to claim 1, further comprising:
   collecting front side mark identification information and said measured position changes into a data-set;
   defining bad marks as being those front side marks having measured position changes larger than a predefined threshold;
   removing said bad marks for said data-set rendering a limited data-set; and
   aligning a patterning device to said substrate using said limited data-set.

4. A device manufacturing method according to claim 2, further comprising:
   analyzing substrate vector plots of consecutively processed substrates;
   adjusting settings of a Chemical Mechanical Polishing device used to polish said substrates.

5. A method of manufacturing a calibration substrate, comprising:
   providing a transparent substrate;
   providing a mask layer on a front side of the transparent substrate;
   patterning said mask layer to render a patterned mask layer on said front side of the transparent substrate;
   providing a resist layer on a back side of the transparent substrate;

exposing said resist layer on said back side of the transparent substrate with light falling on said front side of the transparent substrate and transmitted by said transparent substrate to render an exposed resist layer; and developing said exposed resist layer to render a patterned resist layer on said back side of the transparent substrate.

6. A method according to claim 5, wherein said patterned resist layer on said back side of the transparent substrate has holes, said method further comprising:

filling said holes with a predetermined material;

removing said patterned resist layer.

7. A method according to claim 5, further comprises:

providing holes on the back side of said transparent substrate using said patterned resist layer as a mask; and filling said holes with a predetermined material.

8. A method according to claim 5, further comprising patterning a beam using a mask with an orientation independent pattern.

9. A method according to claim 8, wherein said patterned beam comprises UV radiation.

* * * * *